United States Patent
Cho

(10) Patent No.: US 11,599,411 B2
(45) Date of Patent: Mar. 7, 2023

(54) INTEGRITY CHECK DEVICE FOR SAFETY SENSITIVE DATA AND ELECTRONIC DEVICE INCLUDING THE SAME

(71) Applicant: Samsung Electronics Co., Ltd., Suwon-si (KR)

(72) Inventor: Dongsik Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 207 days.

(21) Appl. No.: 16/943,185

(22) Filed: Jul. 30, 2020

(65) Prior Publication Data
US 2021/0200627 A1 Jul. 1, 2021

(30) Foreign Application Priority Data
Dec. 30, 2019 (KR) .................. 10-2019-0177354

(51) Int. Cl.
*G06F 11/10* (2006.01)
*G06F 11/22* (2006.01)

(52) U.S. Cl.
CPC .................. *G06F 11/1004* (2013.01)

(58) Field of Classification Search
None
See application file for complete search history.

(56) References Cited

U.S. PATENT DOCUMENTS

| | | | | |
|---|---|---|---|---|
| 5,598,424 A * | 1/1997 | Erickson | ............ | H03M 13/091 |
| | | | | 714/704 |
| 6,611,904 B1 * | 8/2003 | Uguen | ............ | G11C 8/16 |
| | | | | 365/189.04 |
| 6,901,552 B1 * | 5/2005 | Fey | ............ | G06F 11/1008 |
| | | | | 714/800 |
| 7,568,130 B2 | 7/2009 | Smith et al. | | |
| 7,774,654 B2 | 8/2010 | Bose et al. | | |
| 9,575,862 B1 * | 2/2017 | Hutton | ............ | G06F 11/0706 |
| 9,891,976 B2 | 2/2018 | Chen et al. | | |
| 10,379,938 B2 | 8/2019 | King et al. | | |
| 2003/0093381 A1 * | 5/2003 | Hohl | ............ | G06F 21/83 |
| | | | | 705/50 |
| 2003/0093743 A1 * | 5/2003 | Berry, Jr. | ............ | H03M 13/09 |
| | | | | 714/758 |
| 2010/0094802 A1 * | 4/2010 | Luotojarvi | ............ | G06F 16/2365 |
| | | | | 707/E17.005 |

(Continued)

*Primary Examiner* — Cynthia Britt
*Assistant Examiner* — Dipakkumar B Gandhi
(74) *Attorney, Agent, or Firm* — Harness, Dickey & Pierce, P.L.C.

(57) ABSTRACT

An integrity check device includes a register array processing circuitry which generates a current cyclic redundancy check (CRC) parity value by sequentially performing a CRC calculation on a plurality of safety sensitive data, stores a reference CRC parity value, outputs a check result signal indicating whether an error occurs by activating a first path and by comparing the current CRC parity value with the reference CRC parity value when the plurality of safety sensitive data are maintained and when an operation of updating the reference CRC parity value is unnecessary, and updates the reference CRC parity value to the current CRC parity value by activating a second path when at least one of the plurality of safety sensitive data is intentionally changed and when the operation of updating the reference CRC parity value is necessary.

20 Claims, 15 Drawing Sheets

(56) References Cited

U.S. PATENT DOCUMENTS

| | | | |
|---|---|---|---|
| 2013/0179760 A1* | 7/2013 | Lee | H03M 13/091 |
| | | | 714/E11.032 |
| 2016/0118105 A1* | 4/2016 | Shido | G11C 11/4093 |
| | | | 365/189.05 |
| 2017/0046218 A1 | 2/2017 | Krishnappa et al. | |
| 2018/0253352 A1 | 9/2018 | Rosenblattl | |
| 2019/0114243 A1 | 4/2019 | Santoni et al. | |
| 2019/0227867 A1 | 7/2019 | Ellur | |
| 2020/0310913 A1* | 10/2020 | Mondello | B60W 50/0205 |
| 2021/0073071 A1* | 3/2021 | Nakaoka | G06F 11/1068 |

* cited by examiner

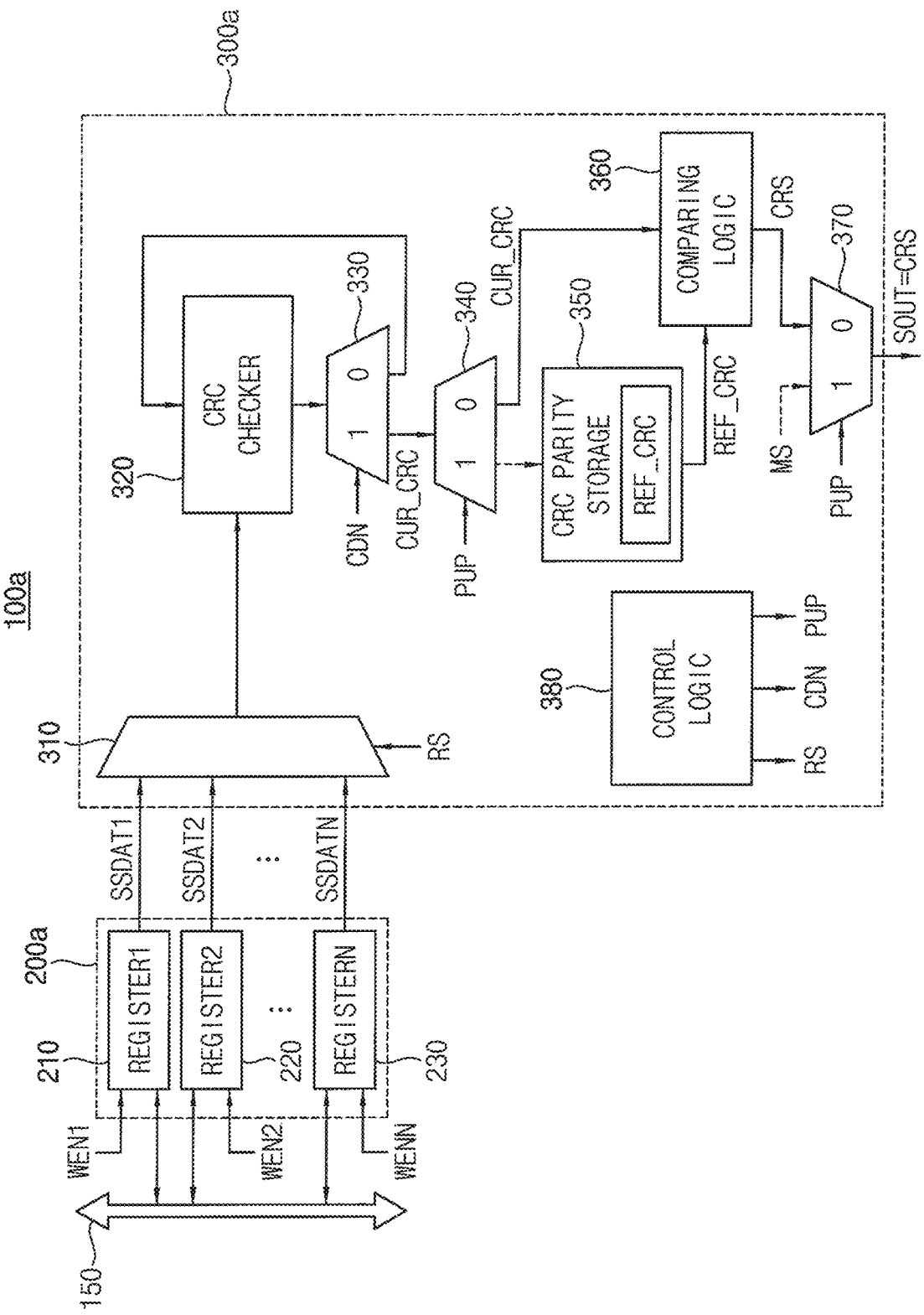

INTEGRITY CHECK DEVICE FOR SAFETY SENSITIVE DATA AND ELECTRONIC DEVICE INCLUDING THE SAME

CROSS-REFERENCE TO RELATED APPLICATION

This application claims priority under 35 USC § 119 to Korean Patent Application No. 10-2019-0177354, filed on Dec. 30, 2019 in the Korean Intellectual Property Office (KIPO), the contents of which are herein incorporated by reference in their entirety.

BACKGROUND

1. Technical Field

Example embodiments relate generally to semiconductor integrated circuits, and more particularly to integrity check devices for safety sensitive data, and electronic devices including the integrity check devices.

2. Description of the Related Art

Typically, an electronic device includes a processing unit that processes data and a storage unit that stores data. The storage unit of the electronic device stores various data. For example, safety sensitive data, which is used for important settings associated with safety of the electronic device and/or affects a safety operation of the electronic device, may be stored in the storage unit based on a default setting value or a value recorded by a user. The safety sensitive data may require higher integrity than other user data.

Recently, owing to the convergence of information communication technologies and the car industry, cars have rapidly become smarter. Accordingly, a car has evolved from a simple mechanism to a smart car, with autonomous driving being particularly highlighted as a core technology of smart cars. For such autonomous driving and/or vehicles, various technologies such as a technology for recognizing the driving environment (e.g., car lanes, ambient vehicles, pedestrians, etc.), a technology for determining the driving condition, a control technology such as steering, acceleration/deceleration, etc., are required, and thus more safety sensitive data may be utilized.

SUMMARY

At least one example embodiment of the present disclosure provide an integrity check device capable of efficiently checking the integrity of safety sensitive data.

At least one example embodiments of the present disclosure provide an electronic device including the integrity check device.

According to example embodiments, an integrity check device includes a register array, and processing circuitry. The register array includes a plurality of registers that store a plurality of safety sensitive data forming one codeword. The processing circuitry generates a current cyclic redundancy check (CRC) parity value by sequentially performing a CRC calculation on the plurality of safety sensitive data, stores a reference CRC parity value, outputs a check result signal indicating whether an error occurs by activating a first path and by comparing the current CRC parity value with the reference CRC parity value when the plurality of safety sensitive data are maintained and when an operation of updating the reference CRC parity value is unnecessary, and updates the reference CRC parity value to the current CRC parity value by activating a second path when at least one of the plurality of safety sensitive data is intentionally changed and when the operation of updating the reference CRC parity value is necessary.

According to example embodiments, an electronic device includes a host device and a first integrity check device. The first integrity check device is controlled by the host device, stores a plurality of first safety sensitive data forming a first codeword that is a single codeword, performs an operation of checking an error in the plurality of first safety sensitive data based on a cyclic redundancy check (CRC) calculation, and performs an operation of updating a first reference CRC parity value. The first integrity check device includes a first register array and first processing circuitry. The first register array includes a plurality of first registers that store the plurality of first safety sensitive data. The first processing circuitry generates a first current CRC parity value by sequentially performing the CRC calculation on the plurality of first safety sensitive data, stores the first reference CRC parity value, outputs a first check result signal indicating whether the error occurs by activating a first path and by comparing the first current CRC parity value with the first reference CRC parity value when the plurality of first safety sensitive data are maintained and when the operation of updating the first reference CRC parity value is unnecessary, and updates the first reference CRC parity value to the first current CRC parity value by activating a second path when at least one of the plurality of first safety sensitive data is intentionally changed and when the operation of updating the first reference CRC parity value is necessary.

According to example embodiments, an integrity check device includes a register array, a first multiplexer, a cyclic redundancy check (CRC) checker, a first demultiplexer, a second demultiplexer, a CRC parity storage, a comparing logic, a second multiplexer and/or a control logic. The register array includes a plurality of registers that store a plurality of safety sensitive data forming one codeword and receive a plurality of write enable signals. The first multiplexer sequentially outputs the plurality of safety sensitive data stored in the plurality of registers based on a register selection signal. The CRC checker generates a current CRC parity value by sequentially performing a CRC calculation on the plurality of safety sensitive data provided from the first multiplexer. The first demultiplexer outputs the current CRC parity value or provides an output of the CRC checker back to the CRC checker, based on a CRC calculation done signal. The second demultiplexer outputs the current CRC parity value provided from the first demultiplexer to a first path or a second path based on a parity update signal. The CRC parity storage stores a reference CRC parity value. The comparing logic generates a check result signal indicating whether an error occurs by comparing the current CRC parity value with the reference CRC parity value. The second multiplexer provides the check result signal as a final output signal through the first path or provides a masking signal for masking an occurrence of the error as the final output signal through the second path, based on the parity update signal. The control logic generates the register selection signal, the CRC calculation done signal and the parity update signal. When the plurality of safety sensitive data are maintained and when an operation of updating the reference CRC parity value is unnecessary, the first path is activated to provide the check result signal as the final output signal. When at least one of the plurality of write enable signals is activated, when at least one of the plurality of safety sensitive data is intentionally changed and when the operation of updating the reference CRC parity value is necessary, the second path is activated to update the reference CRC parity value to the current CRC parity value and to provide the masking signal as the final output signal. When it is determined that the at least one of the plurality of safety sensitive data is intentionally reset or modified while the CRC calculation is sequentially performed on the plurality of safety sensitive data, the reference CRC parity value is updated during a current CRC calculation round or a next CRC calculation round based on whether the CRC calculation is performed on safety sensitive data that is reset or modified.

The integrity check device and the electronic device according to example embodiments may efficiently perform the integrity check operation on the plurality of safety sensitive data using the CRC. In addition, when the at least one of the plurality of safety sensitive data is intentionally changed, the integrity check device and the electronic device may perform the update operation on the reference CRC parity value that is stored in the integrity check device. Accordingly, the integrity check operation may be continuously and efficiently performed not only on the initial values of the plurality of safety sensitive data but also when one or more safety sensitive data are modified by the user.

BRIEF DESCRIPTION OF THE DRAWINGS

Illustrative, non-limiting example embodiments will be more clearly understood from the following detailed description taken in conjunction with the accompanying drawings.

FIGS. 3A, 3B and 4 are diagrams for describing an operation of an integrity check device of FIG. 2.

DETAILED DESCRIPTION OF EMBODIMENTS

Figure 1:
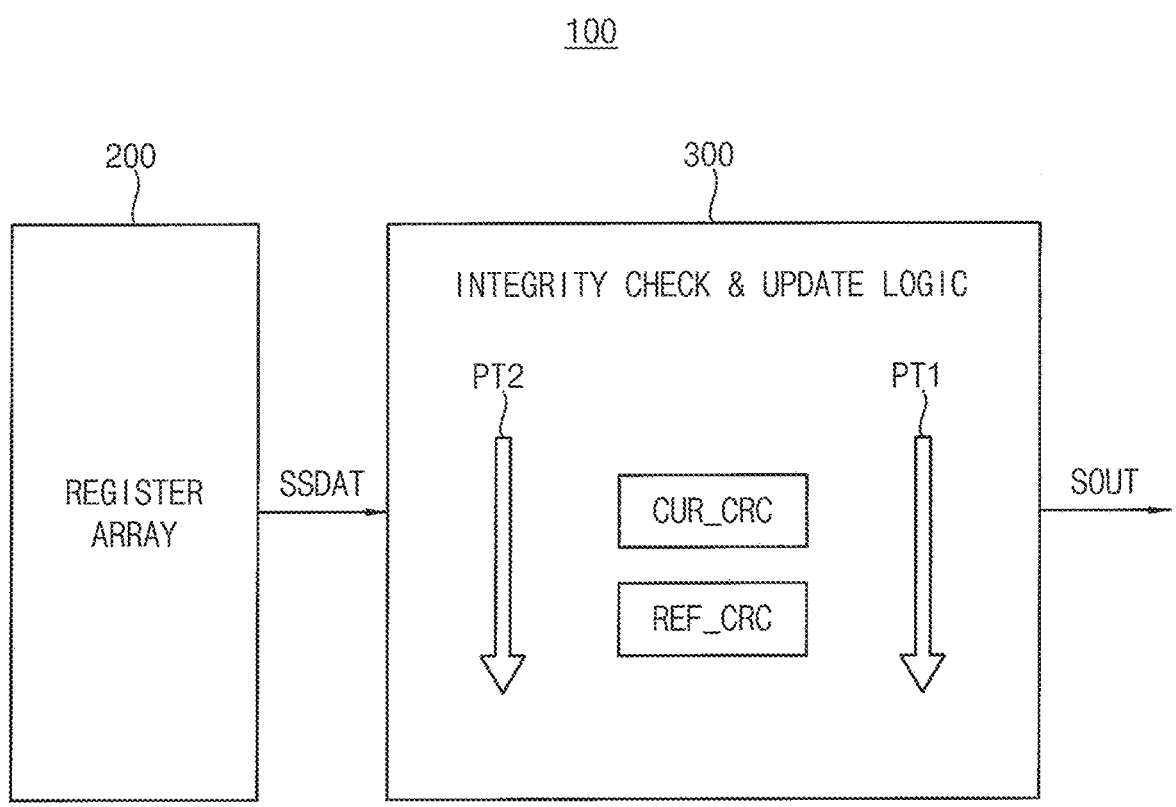
FIG. 1 is a block diagram illustrating an integrity check device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating an integrity check device according to example embodiments.

Referring to FIG. 1, an integrity check device 100 includes a register array 200, and/or an integrity check and update logic (or circuit) 300.

The register array 200 stores a plurality of safety sensitive data SSDAT forming one codeword. As will be described with reference to FIG. 2, the register array 200 includes a plurality of registers that store the plurality of safety sensitive data SSDAT.

The plurality of safety sensitive data SSDAT represent data directly associated with or related to the safety of a user who uses an electronic device including the integrity check device 100. For example, as will be described with reference to FIG. 12, when the electronic device including the integrity check device 100 is applied or employed to an advanced driver assistance system (ADAS), an autonomous driving system, or the like, the plurality of safety sensitive data SSDAT may include various data to ensure or guarantee the safety of a driver, e.g., data for recognizing the driving environment (e.g., car lanes, ambient vehicles, pedestrians, etc.), data for determining the driving condition, data for the driving control such as steering, acceleration/deceleration, etc.

The integrity check and update logic 300 performs an integrity check operation by performing a cyclic redundancy check (CRC) calculation on the plurality of safety sensitive data SSDAT, and performs an update operation to correct or change a reference CRC parity value REF_CRC used to perform the integrity check operation when at least one of the plurality of safety sensitive data SSDAT is intentionally changed by a user.

For example, the integrity check and update logic 300 generates a current CRC parity value CUR_CRC by sequentially performing the CRC calculation on the plurality of safety sensitive data SSDAT, and stores the reference CRC parity value REF_CRC. The reference CRC parity value REF_CRC may represent a CRC parity value for a default value or an initial value of the plurality of safety sensitive data SSDAT, and may be calculated and stored in advance (or pre-calculated and pre-stored). The current CRC parity value CUR_CRC may be generated whenever the integrity check operation is performed. As will be described with reference to FIG. 4, the integrity check operation may be repeated periodically, and thus the current CRC parity value CUR_CRC may be periodically generated.

In addition, the integrity check and update logic 300 includes a first path PT1 and a second path PT2 that are selectively activated or enabled. When all of the plurality of safety sensitive data SSDAT are not changed and are maintained, and when an operation of updating the reference CRC parity value REF_CRC is unnecessary, the integrity check and update logic 300 outputs a check result signal (e.g., a check result signal CRS in FIG. 2) indicating whether an error occurs (or has occurred) by activating the first path PT1 and by comparing the current CRC parity value CUR_CRC with the reference CRC parity value REF_CRC. When the at least one of the plurality of safety sensitive data SSDAT is intentionally changed, and when the operation of updating the reference CRC parity value REF_CRC is necessary, the integrity check and update logic 300 updates the reference CRC parity value REF_CRC to the current CRC parity value CUR_CRC by activating the second path PT2, and then the check result signal CRS may be masked. A final output signal SOUT output from the integrity check and update logic 300 may be the check result signal CRS or a masking signal (e.g., a masking signal MS in FIG. 2) for masking the check result signal CRS.

In other words, the integrity check and update logic 300 may operate in a check phase or a check mode in which the first path PT1 is activated to perform the integrity check operation, or may operate in an update phase or an update mode in which the second path PT2 is activated to perform the update operation, depending on whether the operation of updating the reference CRC parity value REF_CRC is necessary.

A cyclic redundancy check (CRC) is an error-detecting code commonly used in digital networks and storage devices to detect accidental changes to raw data. Blocks of data entering systems performing CRCs get a short check value attached, based on the remainder of a polynomial division of their contents. On retrieval, the calculation is repeated and, in the event the check values do not match, corrective action may be taken against data corruption. CRCs are so called because the check (data verification) value is a redundancy (it expands the message without adding information) and the algorithm is based on cyclic codes. CRCs are popular because they are simple to implement in binary hardware, easy to analyze mathematically, and particularly good at detecting common errors caused by noise in transmission channels. For example, CRCs may be calculated in 1-bit units, and may be used in various manners, such as CRC-16, CRC-32, and the like, depending on the number of bits of data to be calculated.

The integrity check device 100 according to example embodiments may efficiently perform the integrity check operation on the plurality of safety sensitive data SSDAT using the CRC. In addition, when the at least one of the plurality of safety sensitive data SSDAT is intentionally changed, the integrity check device 100 may perform the update operation on the reference CRC parity value REF_CRC that is stored in the integrity check device 100. Accordingly, the integrity check operation may be continuously and efficiently performed not only on the initial values of the plurality of safety sensitive data SSDAT but also when one or more safety sensitive data are modified by the user.

Figure 2:
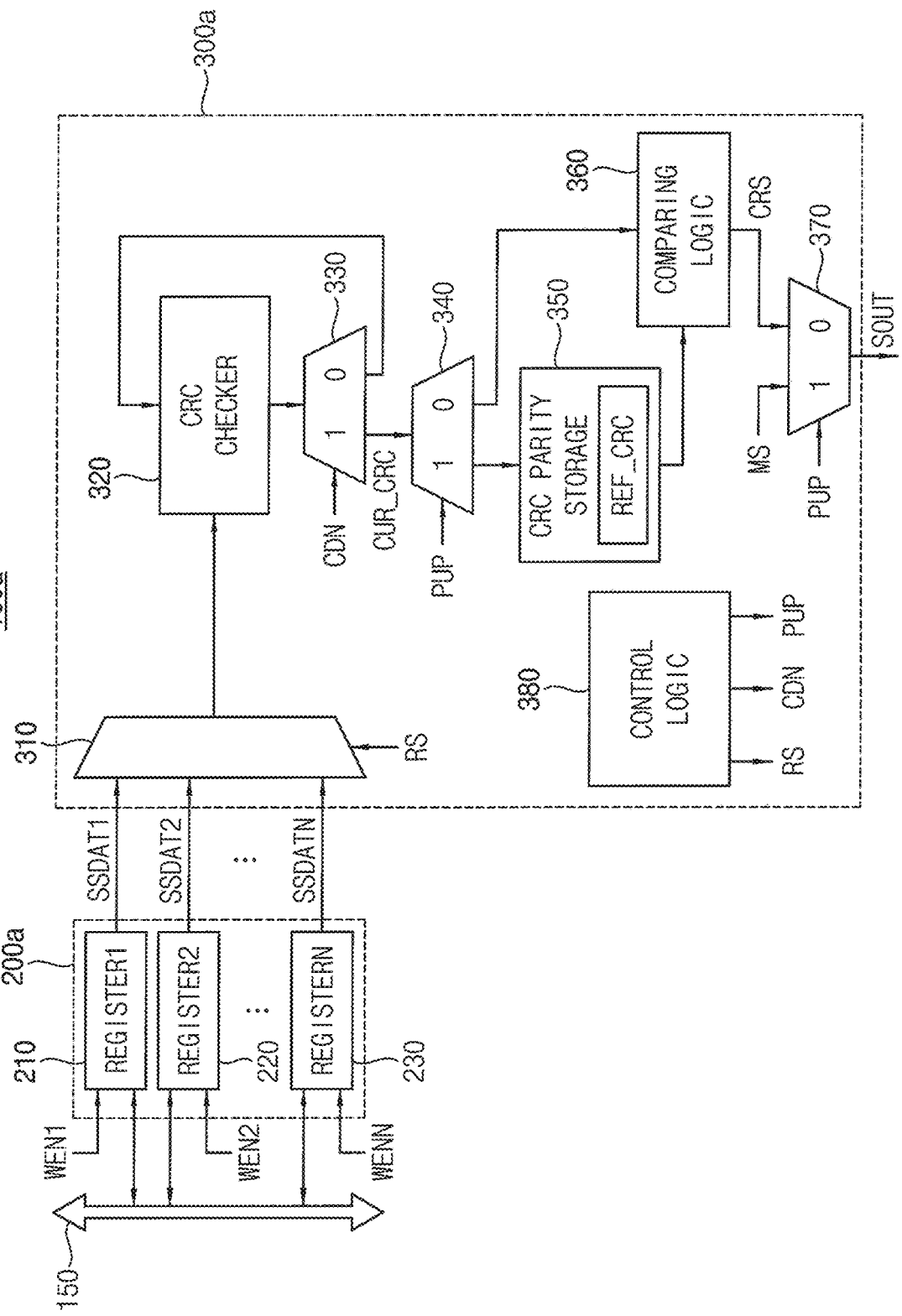
FIG. 2 is a block diagram illustrating a detailed example of an integrity check device of FIG. 1.

FIG. 2 is a block diagram illustrating a detailed example of an integrity check device of FIG. 1.

Referring to FIG. 2, an integrity check device 100a includes a register array 200a and/or an integrity check and update logic 300a.

The register array 200a includes a plurality of registers 210, 220, ..., 230 that store a plurality of safety sensitive data SSDAT1, SSDAT2, ..., SSDATN. For example, each of the plurality of registers 210 to 230 may be a special function register (SFR).

The plurality of registers 210 to 230 may receive a plurality of write enable signals WEN1, WEN2, ..., WENN, and may be connected to a data bus 150. When at least one of the plurality of write enable signals WEN1 to WENN is activated, at least one of the plurality of safety sensitive data SSDAT1 to SSDATN corresponding to the activated write enable signal may be intentionally reset or modified through the data bus 150.

For example, the first register 210 may stores the first safety sensitive data SSDAT1, and may receive the first write enable signal WEN1. When the first write enable signal WEN1 is activated, the first register 210 and the first safety sensitive data SSDAT1 stored in the first register 210 may be intentionally reset or modified.

Although FIG. 2 illustrates N registers 210 to 230, N safety sensitive data SSDAT1 to SSDATN, and N write enable signals WEN1 to WENN where N is a natural number, example embodiments are not limited thereto, and the number of registers, the number of safety sensitive data and the number of write enable signals included in the integrity check device may be variously changed according to example embodiments.

The integrity check and update logic 300a may include a CRC checker 320, a demultiplexer 340, a CRC parity storage 350, a comparing logic (or circuit) 360 and/or a multiplexer 370. The integrity check and update logic 300a may further include a multiplexer 310, a demultiplexer 330 and/or a control logic (or circuit) 380.

The multiplexer 310 may sequentially provide the plurality of safety sensitive data SSDAT1 to SSDATN stored in the plurality of registers 210 to 230 to the CRC checker 320 based on a register selection signal RS. For example, the multiplexer 310 may sequentially output from the first safety sensitive data SSDAT1 to the last safety sensitive data SSDATN.

The CRC checker 320 may generate the current CRC parity value CUR_CRC by sequentially performing the CRC calculation on the plurality of safety sensitive data SSDAT1 to SSDATN. For example, when each of the plurality of safety sensitive data SSDAT1 to SSDATN is 32-bit data, the CRC checker 320 may use CRC-32 to calculate 32-bit data in parallel. For example, the CRC checker 320 may output the current CRC parity value CUR_CRC when all of the CRC calculations are completed from the first safety sensitive data SSDAT1 to the last safety sensitive data SSDATN.

The demultiplexer 330 may provide the current CRC parity value CUR_CRC to the demultiplexer 340 or may provide an output of the CRC checker 320 back to the CRC checker 320, based on a CRC calculation done signal CDN. For example, when the CRC calculation is not completed for all of the plurality of safety sensitive data SSDAT1 to SSDATN, the demultiplexer 330 may receive the CRC calculation done signal CDN having a first logic level (e.g., '0'), and may provide the output of the CRC checker 320 to the CRC checker 320 again to continue performing the CRC calculation. When the CRC calculation is completed for all of the plurality of safety sensitive data SSDAT1 to SSDATN, the demultiplexer 330 may receive the CRC calculation done signal CDN having a second logic level (e.g., '1'), and may provide the current CRC parity value CUR_CRC that is a final output of the CRC checker 320 to the demultiplexer 340.

The demultiplexer 340 may provide the current CRC parity value CUR_CRC to the comparing logic 360 or may provide the current CRC parity value CUR_CRC to the CRC parity storage 350, based on a parity update signal PUP. For example, when the operation of updating the reference CRC parity value REF_CRC is unnecessary (e.g., during the check phase), the demultiplexer 340 may receive the parity update signal PUP having the first logic level (e.g., '0'), and may provide the current CRC parity value CUR_CRC to the comparing logic 360 to perform the integrity check operation. When the operation of updating the reference CRC parity value REF_CRC is necessary (e.g., during the update phase), the demultiplexer 340 may receive the parity update signal PUP having the second logic level (e.g., '1'), and may provide the current CRC parity value CUR_CRC to the CRC parity storage 350 to perform the update operation.

The CRC parity storage 350 may store the reference CRC parity value REF_CRC. The reference CRC parity value REF_CRC may represent a CRC parity value for initial values of the plurality of safety sensitive data SSDAT1 to SSDATN (or for initial values of the plurality of registers 210 to 230). According to example embodiments, the reference CRC parity value REF_CRC may be pre-calculated and pre-stored at the time of manufacturing an electronic device including the integrity check device 100a, or may be calculated and stored at the beginning of operation (e.g., while the electronic device is powered on).

In some example embodiments, the CRC parity storage 350 may include any nonvolatile memories, e.g., an electrically erasable programmable read-only memory (EEPROM), a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc., and/or any volatile memories, e.g., a dynamic random access memory (DRAM), a static random access memory (SRAM), etc.

The comparing logic 360 may generate and output the check result signal CRS by comparing the current CRC parity value CUR_CRC with the reference CRC parity value REF_CRC. For example, when the current CRC parity value CUR_CRC is equal to (or the same as or matched with) the reference CRC parity value REF_CRC, the check result signal CRS may have the first logic level (e.g., '0') representing that an error does not occurred in all of the plurality of safety sensitive data SSDAT1 to SSDATN. When the current CRC parity value CUR_CRC is not equal to (e.g., is different from) the reference CRC parity value REF_CRC, the check result signal CRS may have the second logic level (e.g., '1') representing that an error occurs in the at least one of the plurality of safety sensitive data SSDAT1 to SSDATN.

The multiplexer 370 may provide the check result signal CRS as the final output signal SOUT or may provide the masking signal MS for masking an occurrence of the error as the final output signal S OUT, based on the parity update signal PUP. For example, during the check phase, the multiplexer 370 may receive the parity update signal PUP having the first logic level (e.g., '0'), and may output the check result signal CRS as the final output signal SOUT. During the update phase, the multiplexer 370 may receive the parity update signal PUP having the second logic level (e.g., '1'), and may output the masking signal MS as the final output signal S OUT.

The control logic 380 may control the overall operation of the integrity check and update logic 300a, and may generate the register selection signal RS, the CRC calculation done signal CDN and the parity update signal PUP having an appropriate logic level to perform the above-described operations.

In some example embodiments, at least a part of the components or elements included in the integrity check and update logic 300a may be implemented as hardware. For example, at least a part of the elements included in the integrity check and update logic 300a may be included in a computer-based electronic system.

Figure 3B:
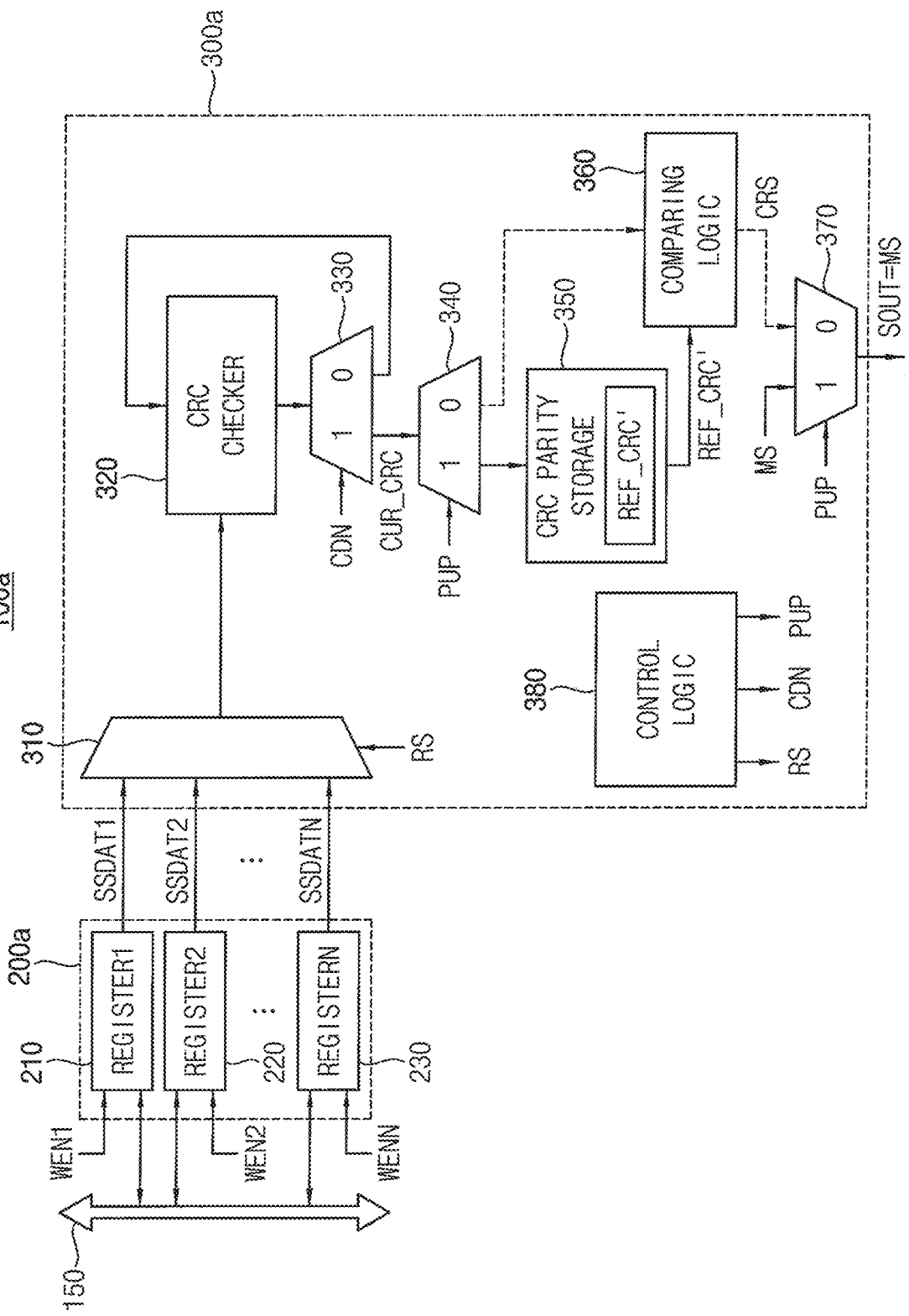
Figure 4:
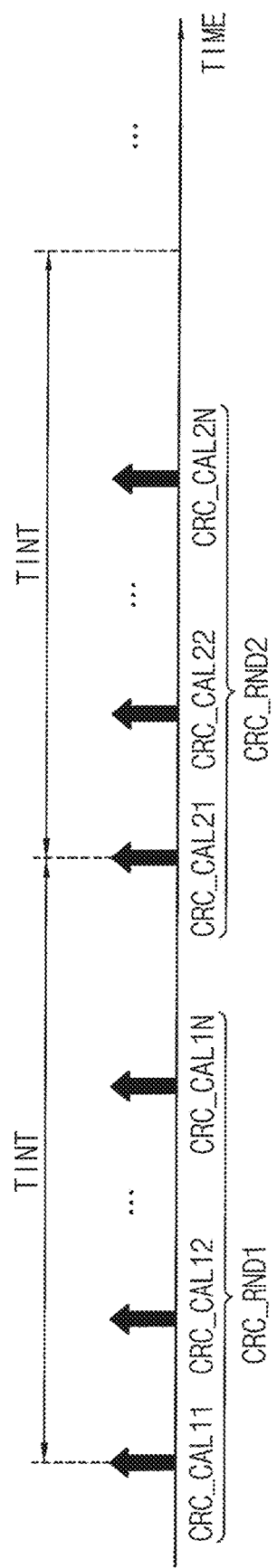

FIGS. 3A, 3B and 4 are diagrams for describing an operation of an integrity check device of FIG. 2.

Referring to FIG. 3A, the integrity check operation performed during the check phase is illustrated.

The multiplexer 310 may sequentially output the plurality of safety sensitive data SSDAT1 to SSDDN. The CRC checker 320 may sequentially receive the plurality of safety sensitive data SSDAT1 to SSDATN, may sequentially perform the CRC calculation, and may generate the current CRC parity value CUR_CRC to output the current CRC parity value CUR_CRC through the demultiplexer 330.

While the CRC calculation is sequentially performed on the plurality of safety sensitive data SSDAT1 to SSDATN, when all of the plurality of safety sensitive data SSDAT1 to SSDATN are maintained without being reset or modified (e.g., when all of the plurality of registers 210 to 230 are not reset or modified) so that the operation of updating the reference CRC parity value REF_CRC is unnecessary, the demultiplexer 340 may output the current CRC parity value CUR_CRC to the comparing logic 360. The CRC parity storage 350 may output the reference CRC parity value REF_CRC to the comparing logic 360. The comparing logic may compare the current CRC parity value CUR_CRC with the reference CRC parity value REF_CRC and may output the check result signal CRS. The multiplexer 370 may provide the check result signal CRS as the final output signal S OUT.

Referring to FIG. 3B, the update operation performed during the update phase is illustrated. A process of generating the current CRC parity value CUR_CRC may be the same or substantially the same as that described with reference to FIG. 3A.

While the CRC calculation is sequentially performed on the plurality of safety sensitive data SSDAT1 to SSDATN, when the at least one of the plurality of safety sensitive data SSDAT1 to SSDATN is intentionally reset or modified (e.g., when at least one of the plurality of registers 210 to 230 is intentionally reset or modified) so that the operation of updating the reference CRC parity value REF_CRC is necessary, the demultiplexer 340 may output the current CRC parity value CUR_CRC to the CRC parity storage 350. The CRC parity storage 350 may update the reference CRC parity value REF_CRC to the current CRC parity value CUR_CRC (e.g., may store the current CRC parity value CUR_CRC as an updated reference CRC parity value REF_CRC'), and may output the updated reference CRC parity value REF_CRC' to the comparing logic 360. The comparing logic 360 may receive the updated reference CRC parity value REF_CRC' and may output the check result signal CRS. The multiplexer 370 may provide the masking signal MS as the final output signal SOUT. In the update phase, since the current CRC parity value CUR_CRC is not provided to the comparing logic 360 and the check result signal CRS output from the comparing logic 360 is always generated to indicate the occurrence of the error, intentional data reset or modification may be reduced or prevented from being judged or determined as the occurrence of the error by outputting the masking signal MS rather than the check result signal CRS.

In some example embodiments, the first path PT1 in FIG. 1 may include a path for providing the current CRC parity value CUR_CRC to the comparing logic 360 through the demultiplexer 340 (e.g., a solid line between the demultiplexer 340 and the comparing logic 360 in FIG. 3A), and a path for providing the check result signal CRS as the final output signal SOUT through the multiplexer 370 (e.g., a solid line between the comparing logic 360 and the multiplexer 370 in FIG. 3A).

In some example embodiments, the second path PT2 in FIG. 1 may include a path for providing the current CRC parity value CUR_CRC to the CRC parity storage 350 through the demultiplexer 340 (e.g., a solid line between the demultiplexer 340 and the CRC parity storage 350 in FIG. 3B), and a path for providing the masking signal MS as the final output signal SOUT through the multiplexer 370 (e.g., a solid line between the masking signal MS and the multiplexer 370 in FIG. 3B).

In the check phase of FIG. 3A, the first path PT1 may be activated, the second path PT2 may be deactivated, and thus the deactivated second path PT2 is illustrated by a dotted line. Similarly, in the update phase of FIG. 3B, the second path PT2 may be activated, the first path PT1 may be deactivated, and thus the deactivated first path PT1 is illustrated by a dotted line.

Referring to FIG. 4, the integrity check operation described with reference to FIG. 3A may be repeated periodically. One CRC calculation round may be formed by sequentially performing the CRC calculation from the first safety sensitive data SSDAT1 to the last safety sensitive data SSDATN within one execution period TINT of the integrity check operation.

For example, during a first execution cycle (or period) TINT of the integrity check operation, the CRC checker 320 may perform a CRC calculation CRC_CAL11 on the first safety sensitive data SSDAT1, a CRC calculation CRC_CAL12 on the second safety sensitive data SSDAT2, and a CRC calculation CRC_CAL1N on the last safety sensitive data SSDATN, and thus a first CRC calculation round CRC_RND1 may be formed or performed. Similarly, during a second execution cycle TINT of the integrity check operation, the CRC checker 320 may perform a CRC calculation CRC_CAL21 on the first safety sensitive data SSDAT1, a CRC calculation CRC_CAL22 on the second safety sensitive data SSDAT2, and a CRC calculation CRC_CAL2N on the last safety sensitive data SSDATN, and thus a second CRC calculation round CRC_RND2 may be formed. The operation of periodically repeating the integrity check operation may be explained as an operation of periodically repeating the CRC calculation round to periodically check whether the error occurs.

The update operation described with reference to FIG. 3B may be performed in various manners according to example embodiments. In some example embodiments, when the at least one of the plurality of safety sensitive data SSDAT1 to SSDATN is intentionally reset or modified while the CRC calculation is sequentially performed, the update operation may be performed while the current CRC calculation round is in progress, or the current CRC calculation round may be stopped and the update operation may be performed during the next CRC calculation round restarted from the beginning. In some example embodiments, when the update operation is performed while the current CRC calculation round is in progress, a scheme of updating the reference CRC parity value REF_CRC may be set differently based on whether the CRC calculation is already performed or is not performed yet on the reset or modified safety sensitive data. The operation of updating the reference CRC parity value REF_CRC will be described in detail with reference to FIGS. 6 and 7.

Figure 5:
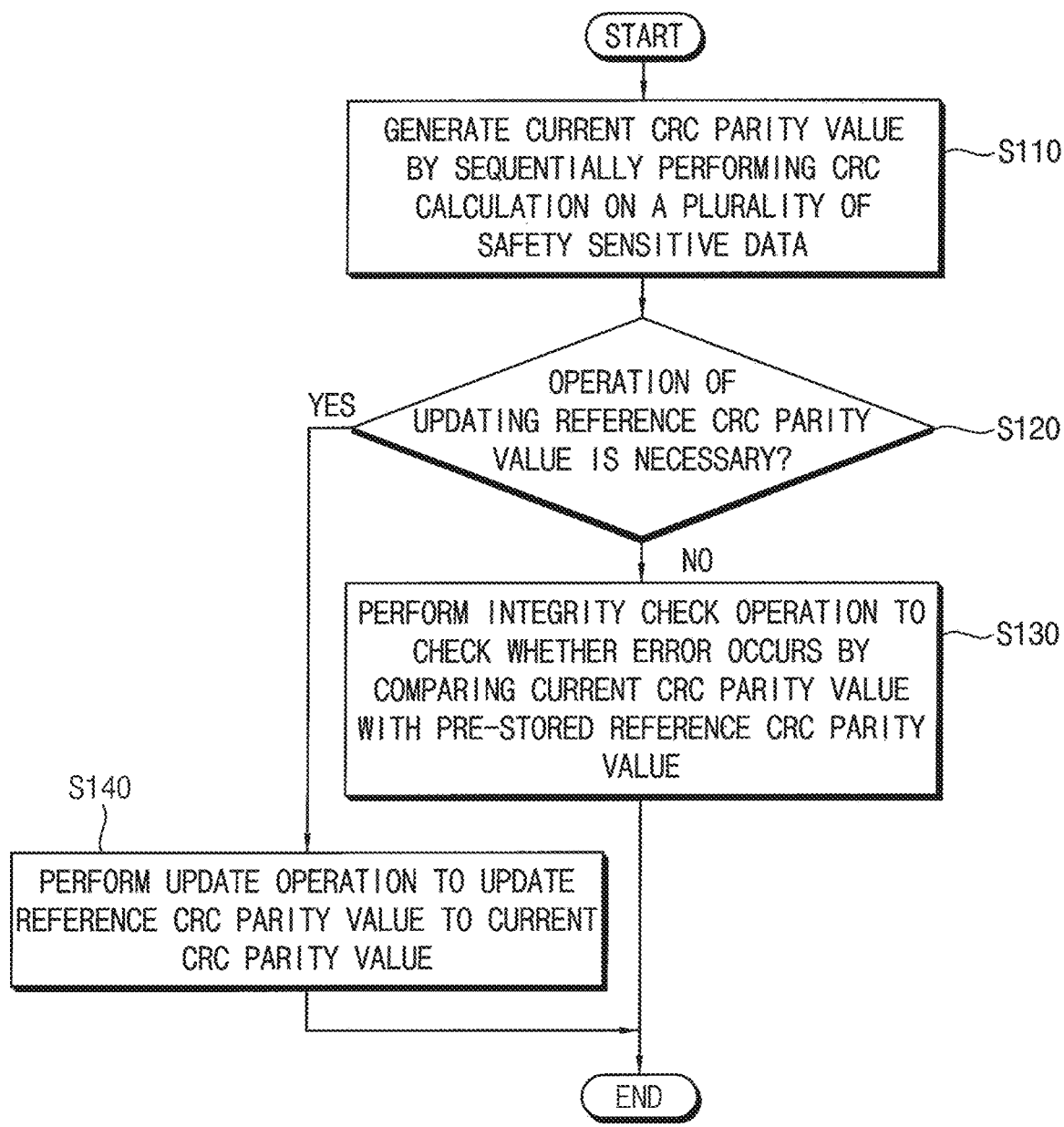
FIG. 5 is a flowchart illustrating a method of checking integrity according to example embodiments.

FIG. 5 is a flowchart illustrating a method of checking integrity according to example embodiments.

Referring to FIG. 5, in a method of checking integrity according to example embodiments, a current CRC parity value is generated by sequentially performing a CRC calculation on a plurality of safety sensitive data that are stored in a plurality of registers and form one codeword (operation S110).

While the CRC calculation is sequentially performed on the plurality of safety sensitive data, it is determined whether an operation of updating of a reference CRC parity value that is stored in advance is necessary (operation S120). For example, when at least one of the plurality of safety sensitive data is intentionally reset or modified, it may be determined that the reference CRC parity value needs to be updated.

When it is determined that the operation of updating of the reference CRC parity value is unnecessary (operation S120: NO), an integrity check operation is performed to check or determine whether an error occurs in the plurality of safety sensitive data by comparing the current CRC parity value generated by completing the CRC calculation with the reference CRC parity value (operation S130). Step S130 may always be performed during a current CRC calculation round.

When it is determined that the operation of updating of the reference CRC parity value is necessary (operation S120: YES), an update operation is performed to update the reference CRC parity value to the current CRC parity value generated by completing the CRC calculation (operation S140). According to example embodiments, operation S140 may be performed during the current CRC calculation round or a next CRC calculation round.

In some example embodiments, the method of checking integrity of FIG. 5 may be performed by the integrity check device described with reference to FIGS. 1 and 2, or may be performed by an integrity check device which will be described with reference to FIG. 9, or may be performed by an electronic device which will be described with reference to FIGS. 10 and 11.

Figure 6:
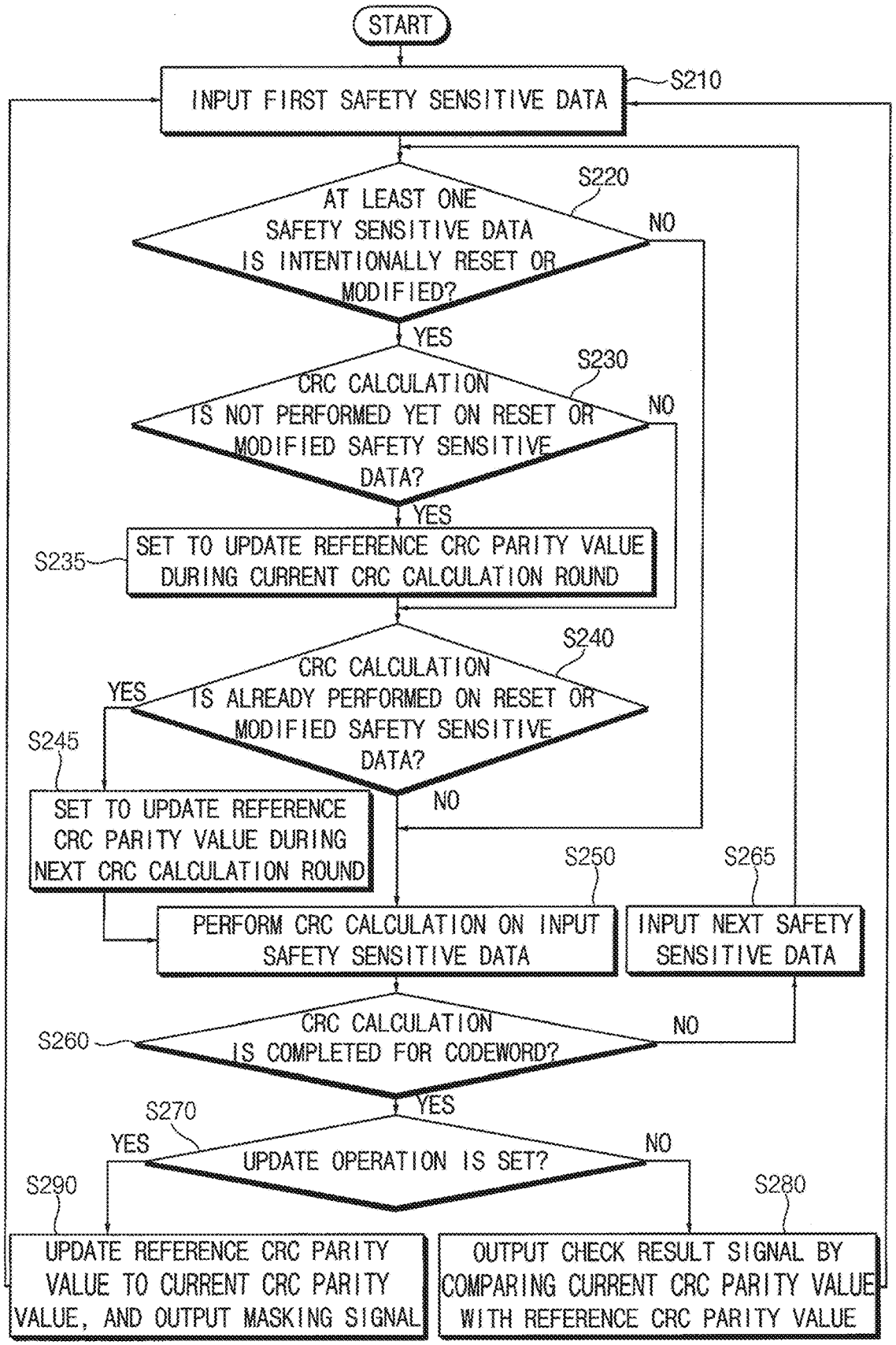
FIGS. 6 and 7 are flowcharts illustrating detailed examples of a method of checking integrity of FIG. 5.
Figure 7:
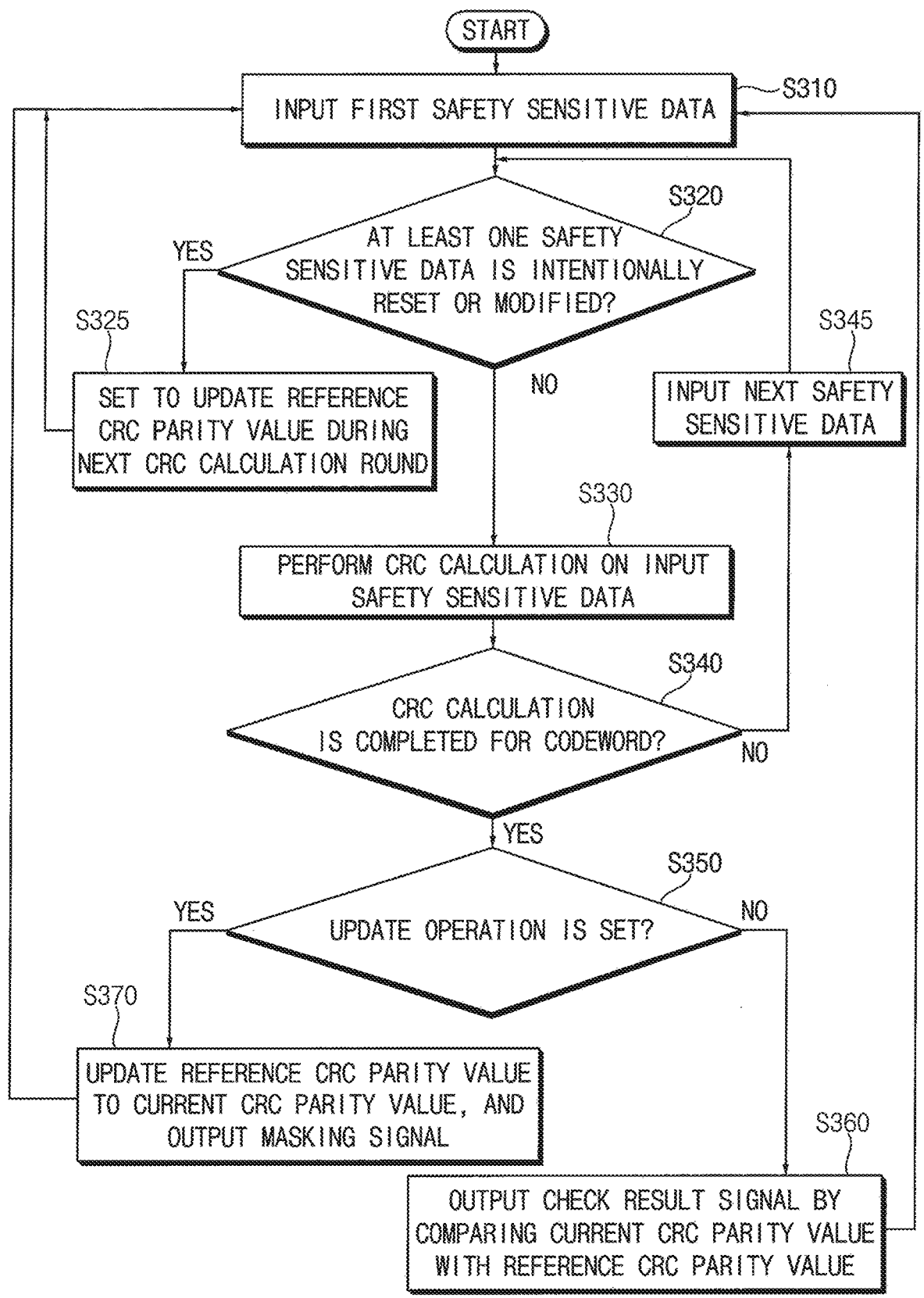

FIGS. 6 and 7 are flowcharts illustrating detailed examples of a method of checking integrity of FIG. 5. Hereinafter, it will be described that the method of checking integrity according to example embodiments is performed by the integrity check device 100a of FIG. 2, for convenience of description.

Referring to FIGS. 2 and 6, in a method of checking integrity according to example embodiments, the first safety sensitive data SSDAT1 among the plurality of safety sensitive data SSDAT1 to SSDAT) stored in the plurality of registers 210 to 230 (or the first register 210 among the plurality of registers 210 to 230) may be set to an input of the CRC checker 320 (operation S210). Thus, a current CRC calculation round may be started.

After the current CRC calculation round is started, it may be checked or determined whether the at least one of the plurality of safety sensitive data SSDAT1 to SSDATN (or the at least one of the plurality of registers 210 to 230) is intentionally reset or modified (operation S220). For example, the plurality of registers 210 to 230 may receive the plurality of write enable signals WEN1 to WENN. When the at least one of the plurality of write enable signals WEN1 to WENN is activated, it may be determined that safety sensitive data corresponding to the activated write enable signal (or a register receiving the activated write enable signal) is intentionally reset or modified.

When it is determined that the at least one of the plurality of safety sensitive data SSDAT1 to SSDATN is intentionally reset or modified (operation S220: YES), it may be checked or determined whether the CRC calculation is not performed yet on the safety sensitive data that is reset or modified, and/or whether the CRC calculation is already performed on the safety sensitive data that is reset or modified (operation S230 and S240).

When the CRC calculation is not performed yet on the safety sensitive data that is reset or modified (operation S230: YES), e.g., when the reset or modified register is a register to perform the CRC calculation currently (e.g., a current register) or a register to perform the CRC calculation subsequently (e.g., a next register), it may be set to update the reference CRC parity value REF_CRC during the current CRC calculation round (operation S235). In other words, operation S235 may represent example embodiments in which the update operation is performed immediately during the current CRC calculation round.

When the CRC calculation is already performed on the safety sensitive data that is reset or modified (operation S240: YES), e.g., when the reset or modified register is a register that has already performed the CRC calculation (e.g., a previous register), it may be set to update the reference CRC parity value REF_CRC during the next CRC calculation round (operation S245). In other words, operation S245 may represent example embodiments in which it is impossible to perform the update operation during the current CRC calculation round, and thus the update operation may be performed during the next CRC calculation round.

When it is determined in operation S230 that the CRC calculation is already performed (operation S230: NO), operation S235 may be omitted. When it is determined in operation S240 that the CRC calculation is not performed yet (operation S240: NO), operation S245 may be omitted. However, when the at least one of the plurality of safety sensitive data SSDAT1 to SSDATN is intentionally reset or modified (operation S220: YES), one of operations S230 and S240 should be determined to be true.

When it is determined that the at least one of the plurality of safety sensitive data SSDAT1 to SSDATN is intentionally reset or modified (operation S220: YES) and when it is set to update the reference CRC parity value REF_CRC during the current CRC calculation round or the next CRC calculation round (operation S230: YES or operation S240: YES), or when it is determined that all of the plurality of safety sensitive data SSDAT1 to SSDATN are not intentionally reset or modified (operation S220: NO), the CRC calculation may be performed on the safety sensitive data (e.g., the first safety sensitive data SSDAT1) set as the input of the CRC checker 320 (operation S250). In the example of FIG. 6, the CRC calculation may be continuously and sequentially performed on the plurality of safety sensitive data SSDAT1 to SSDDN without stopping or terminating the CRC calculation, even if it is determined that the at least one of the plurality of safety sensitive data SSDAT1 to SSDATN is intentionally reset or modified. In other words, the current CRC calculation round may be continued without being interrupted or terminated.

After that, it may be checked or determined whether the CRC calculation is completed for all of the plurality of safety sensitive data SSDAT1 to SSDATN forming one codeword (e.g., for all of the plurality of registers 210 to 230) (operation S260). For example, it may be confirmed whether all of the CRC calculations are completed from the first safety sensitive data SSDAT1 to the last safety sensitive data SSDATN.

When the CRC calculation is not completed for all of the plurality of safety sensitive data SSDAT1 to SSDATN (operation S260: NO), next safety sensitive data (e.g., the next register) subsequent to the safety sensitive data on which the CRC calculation in operation S250 is performed may be set as the input of the CRC checker 320 (operation S265), and operations S220, S230, S235, S240, S245, S250 and S260 may be repeated for the next safety sensitive data.

When the CRC calculation is completed for all of the plurality of safety sensitive data SSDAT1 to SSDATN (operation S260: YES), the current CRC parity value CUR_CRC may be generated. After that, it may be checked or determined whether the reference CRC parity value REF_CRC is set to be updated (operation S270).

When both operations S235 and S245 are not performed and when it is not set to update the reference CRC parity value REF_CRC (operation S270: NO), the check result signal CRS may be output by comparing the current CRC parity value CUR_CRC with the reference CRC parity value REF_CRC (operation S280). In other words, the integrity check operation described with reference to FIG. 3A may be performed.

When operation S235 or operation S245 is performed and when it is set to update the reference CRC parity value REF_CRC (operation S270: YES), the reference CRC parity value REF_CRC may be updated to the current CRC parity value CUR_CRC, and the masking signal MS may be output to mask the check result signal CRS (operation S290). In other words, the update operation described with reference to FIG. 3B may be performed. When operation S235 is performed, the reference CRC parity value REF_CRC may be updated during the current CRC calculation round, and a check result of the current CRC calculation round may be masked. When operation S245 is performed, the reference CRC parity value REF_CRC may be updated during the next CRC calculation round, and a check result of the next CRC calculation round may be masked.

In some example embodiments, when two or more safety sensitive data are reset or modified, and when both operations S230 and S240 are determined to be true and both operations S235 and S245 are performed, the reference CRC parity value REF_CRC may be updated during both the current CRC calculation round and the next CRC calculation round, or the reference CRC parity value REF_CRC may be updated only during the next CRC calculation round. In this example, the check results of both the current CRC calculation round and the next CRC calculation round may be masked.

After operation S280 or S290 is performed, the current CRC calculation round in a current execution cycle may be completed, and then the next CRC calculation round performed again from operation S210 may be started when a next execution cycle is started.

Referring to FIG. 7, operations S310 and S320 in FIG. 7 may be the same or substantially the same as operations S210 and S220 in FIG. 6, respectively.

Unlike the example of FIG. 6, when it is determined that the at least one of the plurality of safety sensitive data SSDAT1 to SSDATN is intentionally reset or modified (operation S320: YES), it may be always set to update the reference CRC parity value REF_CRC during the next CRC calculation round in the example of FIG. 7 (operation S325). In addition, the CRC calculation on the plurality of safety sensitive data SSDAT1 to SSDATN may be stopped or terminated, and may be performed again from the beginning. In other words, the current CRC calculation round may be stopped or terminated, and the next CRC calculation round may be started.

After that, operations S330, S340, S345, S350, S360 and S370 in FIG. 7 may be the same or substantially the same as operations S250, S260, S265, S270, S280 and S290 in FIG. 6, respectively.

Figure 8A:
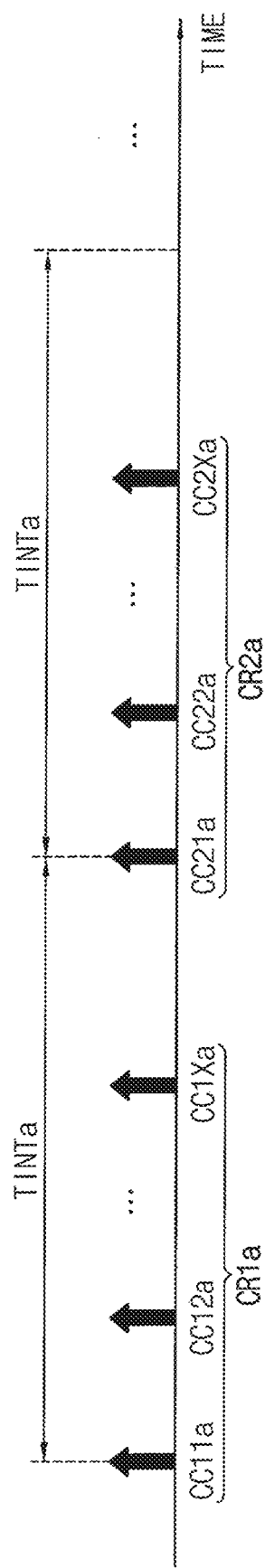
FIGS. 8A, 8B and 8C are diagrams for describing an operation of an integrity check device according to example embodiments.
Figure 8B:
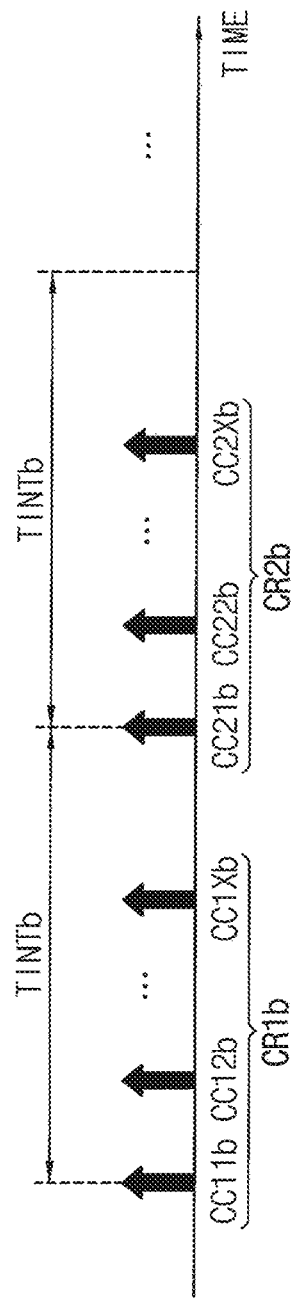
Figure 8C:
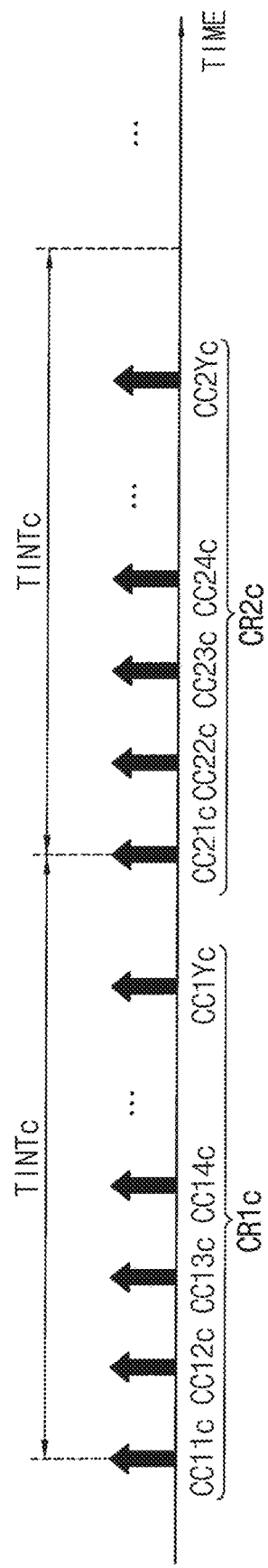

FIGS. 8A, 8B and 8C are diagrams for describing an operation of an integrity check device according to example embodiments.

Referring to FIG. 8A, one CRC calculation round may be formed by sequentially performing the CRC calculation on X safety sensitive data where X is a natural number greater than or equal to two, and an execution cycle of the integrity check operation or the CRC calculation round may be TINTa. For example, a first CRC calculation round CR1a may be formed by sequentially performing CRC calculations CC11a, CC12a, ..., CC1Xa on the X safety sensitive data during a first execution cycle TINTa, and a second CRC calculation round CR2a may be formed by sequentially performing CRC calculations CC21a, CC22a, ..., CC2Xa on the X safety sensitive data during a second execution period TINTa.

In the example of FIG. 8A, the execution cycle TINTa of the CRC calculation round may be longer than or equal to a reference cycle, and the number of safety sensitive data or the number of registers (e.g., X) may be less than or equal to a reference number. In the example of FIG. 8A, example embodiments may be implemented as described with reference to FIG. 6 such that the current CRC calculation round may be continued without being interrupted or terminated even if at least one safety sensitive data is intentionally reset or modified during the current CRC calculation round, or may be implemented as described with reference to FIG. 7 such that the current CRC calculation round is stopped and the next CRC calculation round is started when at least one safety sensitive data is intentionally reset or modified during the current CRC calculation round.

Referring to FIG. 8B, one CRC calculation round may be formed by sequentially performing the CRC calculation on X safety sensitive data, and an execution cycle of the integrity check operation or the CRC calculation round may be TINTb. For example, a The first CRC calculation round CR1b may be formed by sequentially performing CRC calculations CC11b, CC12b, ..., CC1Xb on the X safety sensitive data during a first execution cycle TINTb, and a second CRC calculation round CR2b may be formed by sequentially performing CRC calculations CC21b, CC22b, ..., CC2Xb on the X safety sensitive data during a second execution period TINTb.

In some example embodiments, an execution cycle of the CRC calculation round may decrease as an importance degree of the plurality of safety sensitive data increases. For example, the importance degree of the safety sensitive data in FIG. 8B may be higher than that of the safety sensitive data in FIG. 8A.

Referring to FIG. 8C, one CRC calculation round may be formed by sequentially performing the CRC calculation on Y safety sensitive data where Y is a natural number greater than or equal to two, and an execution cycle of the integrity check operation or the CRC calculation round may be TINTc. For example, a first CRC calculation round CR1c may be formed by sequentially performing CRC calculations CC11c, CC12c, CC13c, CC14c, ..., CC1Yc on the Y safety sensitive data during a first execution cycle TINTc, and a second CRC calculation round CR2c may be formed by sequentially performing CRC calculations CC21c, CC22c, CC23c, CC24c, ..., CC2Yc on the Y safety sensitive data during a second execution cycle TINTc.

In the example of FIG. 8B, the execution cycle TINTb of the CRC calculation round may be shorter than the reference cycle. In the example of FIG. 8C, the number of safety sensitive data or the number of registers (e.g., Y) may be greater than the reference number. In the examples of FIGS. 8B and 8C, example embodiments may not be implemented as described with reference to FIG. 7 such that the current CRC calculation round is stopped and the next CRC calculation round is started when at least one safety sensitive data is intentionally reset or modified during the current CRC calculation round, because of a lack of calculation time, a waste of resources, etc. In the examples of FIGS. 8B and 8C, example embodiments may be implemented as described with reference to FIG. 6 such that the current CRC calculation round may be continued without being interrupted or terminated even if at least one safety sensitive data is intentionally reset or modified during the current CRC calculation round.

Typically, as the execution cycle of the CRC calculation round becomes shorter, and as the number of the safety sensitive data or the number of registers increases, it may be difficult to implement as in the example of FIG. 7, and it may be advantageous to implement as in the example of FIG. 6.

Figure 9:
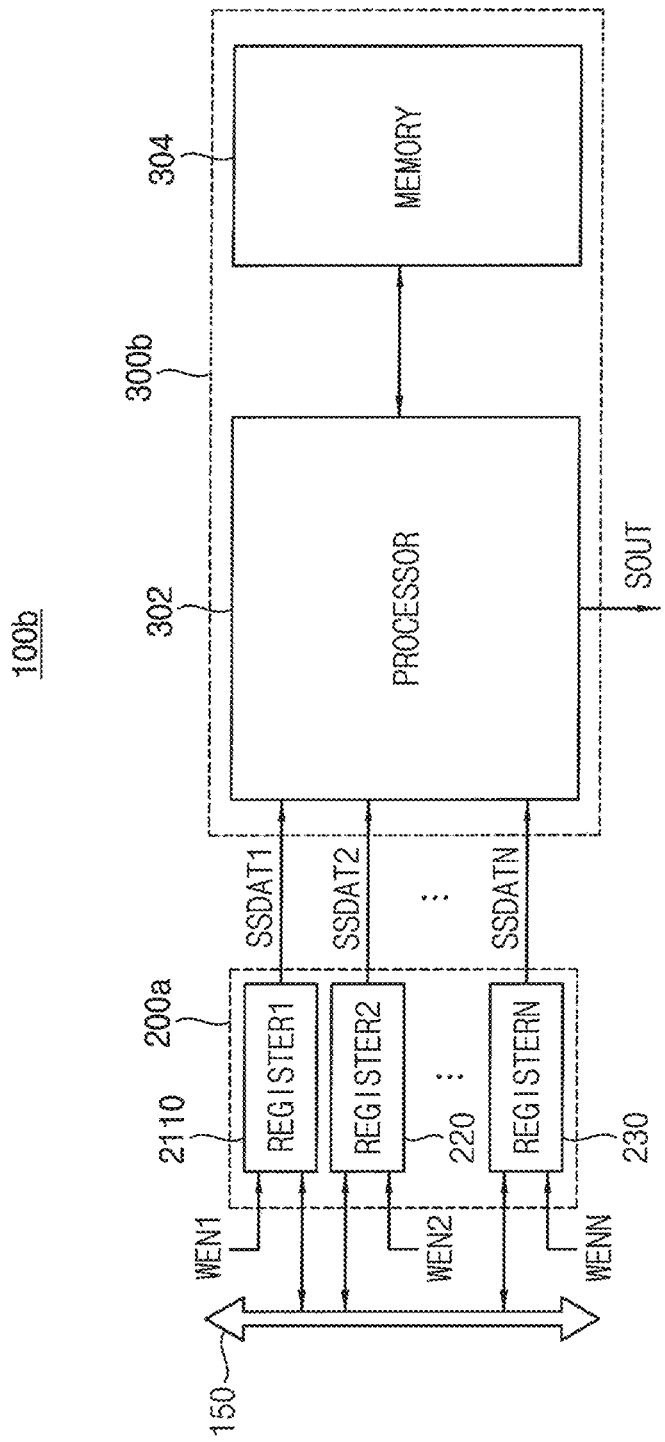
FIG. 9 is a block diagram illustrating another detailed example of an integrity check device of FIG. 1.

FIG. 9 is a block diagram illustrating another detailed example of an integrity check device of FIG. 1. The descriptions repeated with FIG. 2 will be omitted.

Referring to FIG. 9, an integrity check device 100b includes a register array 200a and/or an integrity check and update logic 300b.

The integrity check device 100b of FIG. 9 may be the same or substantially the same as the integrity check device 100a of FIG. 2, except that the integrity check and update logic 300b is changed. The register array 200a in FIG. 9 may be the same or substantially the same as the register array 200a in FIG. 2.

The integrity check and update logic 300b may include a processor 302 and a memory 304.

The memory 304 may store instructions or program codes executable by the processor 302. The processor 302 may operate the same or substantially the same as the integrity check and update logic 300a in FIG. 2, and may perform the method of checking integrity described with reference to FIGS. 5 through 7, by executing the instructions or program codes stored in the memory 304. In other words, the integrity check and update logic 300b in FIG. 9 may represent example embodiments in which at least a part of the components or elements included in the integrity check and update logic 300a in FIG. 2 is implemented as instruction codes or program routines (e.g., a software program). For example, the instruction codes or the program routines may be executed by a computer-based electronic system, and may be stored in any storage device located inside or outside the computer-based electronic system.

Figure 10:
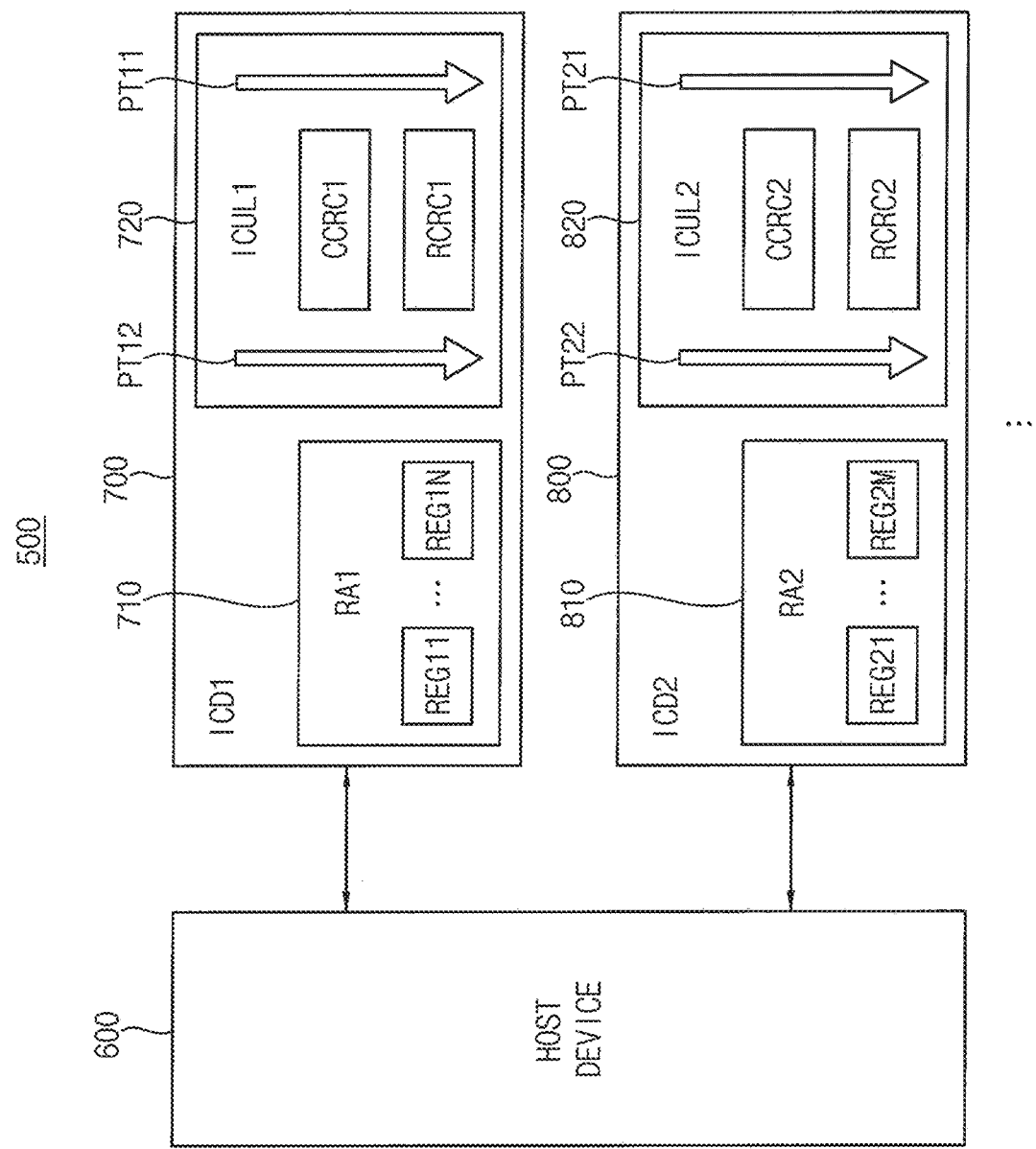
FIG. 10 is a block diagram illustrating an electronic device according to example embodiments.

FIG. 10 is a block diagram illustrating an electronic device according to example embodiments.

Referring to FIG. 10, an electronic device 500 includes a host device 600, a first integrity check device 700 and/or a second integrity check device 800.

The host device 600 controls overall operation of the electronic device 500. The host device 600 may be referred to as an upper level device or system that controls the first integrity check device 700 and the second integrity check device 800.

The first integrity check device 700 is controlled by the host device 600, stores a plurality of first safety sensitive data forming a first codeword that is a single codeword, performs an operation of checking an error in the plurality of first safety sensitive data based on a CRC calculation, and performs an operation of updating a first reference CRC parity value RCRC1. The second integrity check device 800 is controlled by the host device 600, stores a plurality of second safety sensitive data forming a second codeword that is a single codeword, performs an operation of checking an error in the plurality of second safety sensitive data based on the CRC calculation, and performs an operation of updating a second reference CRC parity value RCRC2.

Each of the first integrity check device 700 and the second integrity check device 800 may be the integrity check device according to example embodiments described with reference to FIGS. 1 through 9. For example, the first integrity check device 700 may include a first register array (RA1) 710 that includes a plurality of first registers REG11, ..., REG1N, and a first integrity check and update logic (ICUL1) 720 that generates a first current CRC parity value CCRC1, stores the first CRC reference parity value RCRC1, and includes first and second paths PT11 and PT12. The second integrity check device 800 may include a second register array (RA2) 810 that includes a plurality of second registers REG21, ..., REG2M, and a second integrity check and update logic (ICUL2) 820 that generates a second current CRC parity value CCRC2, stores the second CRC reference parity value RCRC2, and includes first and second paths PT21 and PT22.

The number of the first registers REG11 to REG1N may be N, and the number of the second registers REG21 to REG2M may be M, where M is a natural number greater than or equal to two. According to example embodiments, the number of the first registers REG11 to REG1N and the number of the first safety sensitive data may be equal or substantially equal to or different from the number of the second registers REG21 to REG2M and the number of the second safety sensitive data, respectively.

According to example embodiments, an importance degree of the first safety sensitive data may be the same or substantially the same as or different from an importance degree of the second safety sensitive data, and thus an execution cycle of the integrity check operation on the first safety sensitive data may also be the same or substantially the same as or different from an execution cycle of the integrity check operation on the second safety sensitive data.

Although FIG. 10 illustrates only two integrity check devices 700 and 800, example embodiments are not limited thereto, and the number of integrity check devices included in the electronic device may be variously changed according to example embodiments.

As will be appreciated by those skilled in the art, the inventive concepts may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 11:
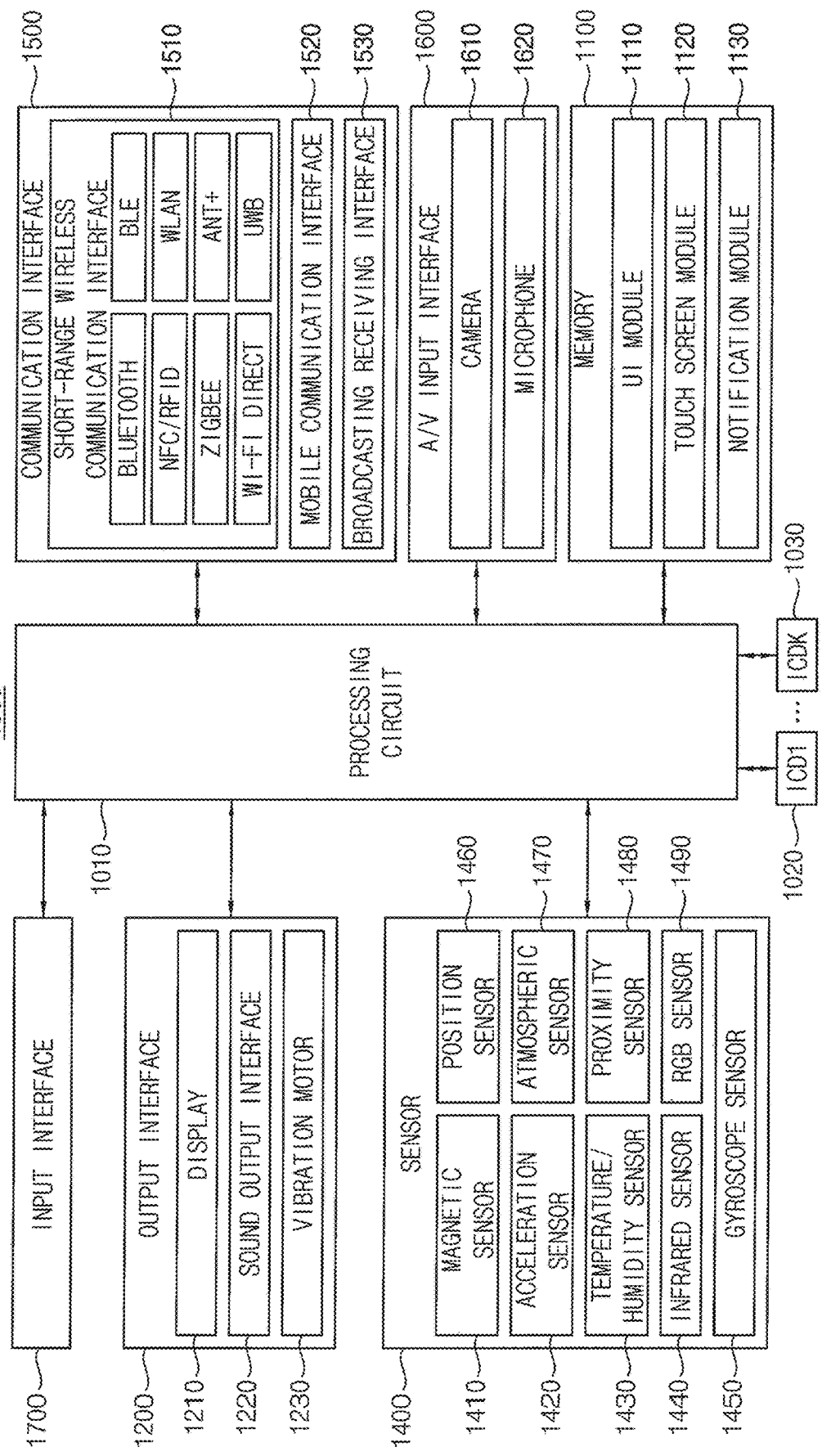
FIG. 11 is a block diagram illustrating an electronic device according to example embodiments.

FIG. 11 is a block diagram illustrating an electronic device according to example embodiments.

Referring to FIG. 11, an electronic device 1000 includes a processing circuit 1010 and a plurality of integrity check devices (ICD1, ..., ICDK) 1020, ..., 1030. The electronic device 1000 may further include a memory 1100, an output interface (e.g., including output circuitry) 1200, a sensor 1400, a communication interface (e.g., including communication circuitry) 1500, an audio/video (A/V) input interface (e.g., including A/V input circuitry) 1600, and an input interface (e.g., including input circuitry) 1700. As will be described with reference to FIG. 12, the electronic device 1000 may be an ADAS, an autonomous driving system, or the like, that is mounted, equipped or installed in a vehicle.

The processing circuit 1010 includes various processing circuitry and controls general operations of the electronic device 1000. The plurality of integrity check devices 1020 and 1030 are controlled by the processing circuit 1010, store safety sensitive data and perform integrity check and update operations. The processing circuit 1010 and the plurality of integrity check devices 1020 and 1030 may correspond to the host device 600 and the integrity check devices 700 and 800 in FIG. 10, respectively.

The input interface 1700 may receive an input for controlling an operation of a module mounted in a vehicle.

The output interface 1200 may include various circuitry to output an audio signal, a video signal, and/or a vibration signal, and may include a display 1210, a sound output interface (e.g., including sound output circuitry) 1220, and a vibration motor 1230. For example, the output interface 1200 may output a notification message as an audio, a video, and/or vibration.

The display 1210 may display and output information processed in the electronic device 1000. For example, the display 1210 may display a notification message on a head up display (HUD) of a vehicle. The sound output interface 1220 may include various circuitry to output audio data received from the communication interface 1500 or stored in the memory 1100. Also, the sound output interface 1220 may output a sound signal (e.g., a call signal reception sound, a message reception sound, a notification sound) related to functions performed in the electronic device 1000.

The processing circuit 1010 may generally control the input interface 1700, the output interface 1200, the sensor 1400, the communication interface 1500, the A/V input interface 1600, or the like, by executing programs stored in the memory 1100. Also, the processing circuit 1010 may perform the functions of the electronic device 1000, by executing the programs stored in the memory 1100. The processing circuit 1010 may include at least one processor. The processing circuit 1010 may include a plurality of processors or an integrated one processor, based on functions and operations thereof.

The sensor 1400 may include various sensors and sensing circuitry to sense a state of the electronic device 1000, a state of a user, or a state around the electronic device 1000, and may transmit sensed information to the processing circuit 1010.

The sensor 1400 may include various sensing circuitry, such as, for example, and without limitation, at least one of a magnetic sensor 1410, an acceleration sensor 1420, a temperature/humidity sensor 1430, an infrared sensor 1440, a gyroscope sensor 1450, a position sensor (e.g., global positioning system (GPS)) 1460, an atmospheric sensor 1470, a proximity sensor 1480, and an RGB sensor 1490, but is not limited thereto.

The communication interface 1500 may include various communication circuitry including at least one component configured to enable the electronic device 1000 to communicate with another electronic device (not illustrated) and a server (not illustrated). The other electronic device may be a computing device or a sensor, but is not limited thereto. For example, the communication interface 1500 may include a short-range wireless communication interface 1510, a mobile communication interface 1520, and a broadcasting receiving interface 1530.

The short-range wireless communication interface 1510 may include a Bluetooth communication interface, a Bluetooth low energy (BLE) communication interface, a near-field communication and/or radio frequency identification (NFC/RFID) interface, a WLAN (e.g., Wi-fi) communication interface, a Zigbee communication interface, an infrared data association (IrDA) communication interface (not illustrated), a Wi-fi direct (WFD) communication interface, a ultra wideband (UWB) communication interface, an Ant+ communication interface, or the like, but is not limited thereto.

The A/V input interface 1600 may include various A/V interface circuitry and is configured to input an audio signal or a video signal, and may include a camera 1610, a microphone 1620, or the like. The camera 1610 may obtain an image frame, such as a still image or a video, via an image sensor, in a videotelephony mode or a photographing mode. The image captured by the image sensor may be processed by the processing circuit 1010 or an additional image processor (not illustrated).

The microphone 1620 may receive an external sound signal and process the external sound signal as electrical sound data. For example, the microphone 1620 may receive the sound signal from an external device or the user. The microphone 1620 may use various noise-removal algorithms to remove noise generated in a process of receiving the external sound signal.

The memory 1100 may store programs for the processing and controlling operations of the processing circuit 1010, and may store data that is input to the electronic device 1000 or output from the electronic device 1000.

The memory 1100 may include at least one type of storage medium from among a flash memory type, a hard disk type, a multimedia card micro type. The programs stored in the memory 1100 may be divided into a plurality of modules based on their functions. For example, the programs may be divided into a user interface (UI) module 1110, a touch screen module 1120, and a notification module 1130.

The UI module 1110 may provide a specialized UI, a graphic user interface (GUI), etc., which are synchronized to the electronic device 1000, for each application. The touch screen module 1120 may sense a touch gesture on a touch screen via the user, and transmit information related to the touch gesture to the processing circuit 1010. The touch screen module 1120 may be implemented as additional hardware including a controller.

The notification module 1130 may generate a signal to notify about occurrence of an event. The notification module 1130 may output the notification signal as a video signal via the display 1210, output the notification signal as an audio signal via the sound output interface 1220, or output the notification signal as a vibration signal via the vibration motor 1230.

Figure 12:
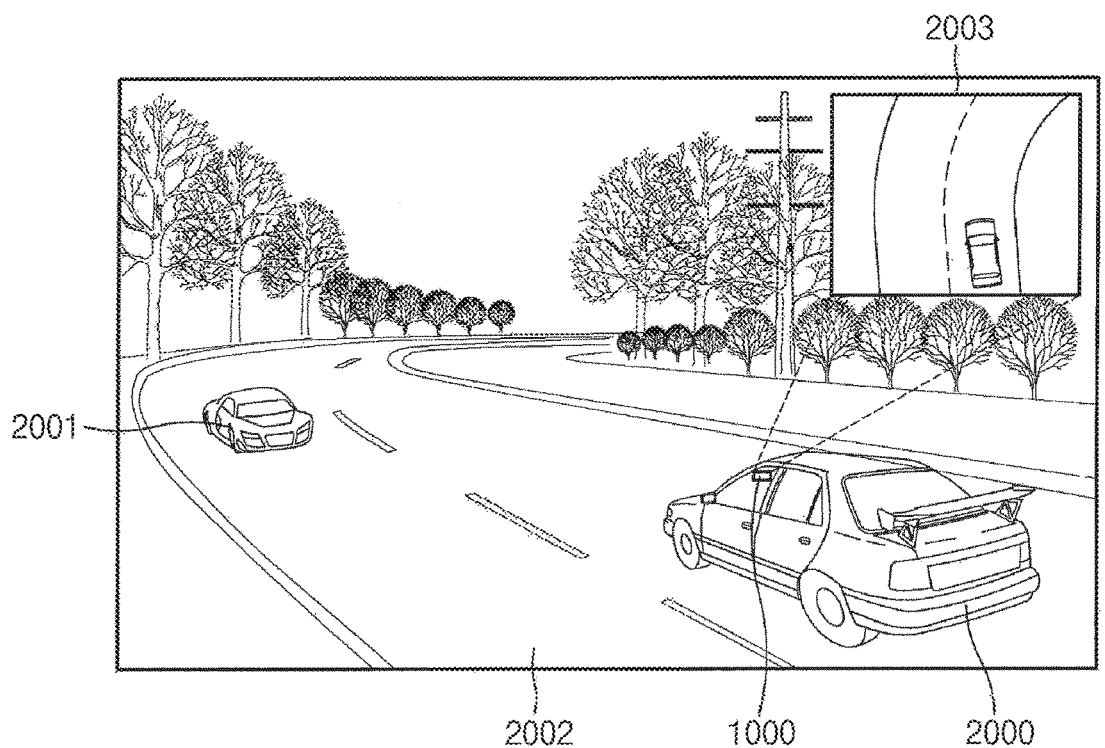
FIG. 12 is a diagram illustrating an example in which an electronic device according to example embodiments is mounted in a vehicle.

FIG. 12 is a diagram illustrating an example in which an electronic device according to example embodiments is mounted in a vehicle.

Referring to FIG. 12, an electronic device 1000 may be an ADAS, an autonomous driving system, or the like, that is included (e.g., mounted) in a vehicle 2000. The electronic device 1000 may include various instances of circuitry and components configured to receive a video sequence including a stereo image, reflected waves (e.g., reflected electromagnetic waves), or reflected lights from a camera mounted in the vehicle 2000 and determine occurrence of various events associated with the vehicle 2000. The various events may include object detection, object tracking and scene segmentation. The electronic device 1000 may generate an output signal that includes a notification message that may be presented to an occupant (e.g., user) of the vehicle 2000, via one or more user interfaces of the vehicle 2000, based on a determined occurrence of one or more events. The electronic device 1000 may generate an output signal that causes a vehicle control system of the vehicle 2000 to control one or more driving elements of the vehicle 2000 to control the driving (e.g., driving trajectory) of the vehicle 2000, based on a determined occurrence of one or more events.

While it is described that the electronic device 1000 receives the video sequence from the camera mounted in the vehicle 2000, example embodiments are not limited thereto. The electronic device 1000 may receive the video sequence from a camera to capture a surrounding environment of the vehicle 2000. The surrounding environment of the vehicle 2000 (also referred to herein as a driving environment associated with the vehicle 2000) may include, for example, a front side, lateral sides, and a rear side.

In some example embodiments, the electronic device 1000 may detect an event based on location of the event by tracking a bounding box designating the object and thus, may differently recognize levels of importance of a type of object based on locations thereof, thereby determining whether an event occurs based on the locations of the object.

In some example embodiments, the electronic device 1000 may detect at least one video sequence (or, a stereo image) 2003 including an object, from among a plurality of video sequences, and may obtain radar reflected waves (e.g., reflected electromagnetic waves) or reflected lights (not illustrated). Reflected waves may be captured at one or more sensors at the vehicle 2000 and may be reflected from one or more objects located in the surrounding environment (e.g., driving environment). The electronic device 1000 may detect a road 2002 including a fixed pattern and another vehicle 2001 moving according to time, by analyzing the at least one video sequence 2003. In some example embodiments, the electronic device 1000 may determine occurrence of an event based on detection of the other vehicle 2001, by analyzing a location of the other vehicle 2001 by analyzing a coordinate of the other vehicle 2001 in the at least one video sequence 2003. The electronic device 1000 may further, based on the determination, generate an output signal that, when processed by a control system of the vehicle 2000, causes a particular notification message to be presented to an occupant of the vehicle 2000 via a user interface of the vehicle 2000 and/or causes driving of the vehicle 2000 to be controlled to cause the vehicle 2000 to be driven along a particular driving path (e.g., driving trajectory) through the surrounding environment (e.g., autonomous driving, driving the vehicle 2000 as an autonomous vehicle, etc.).

In some example embodiments, the vehicle 2000 may include any means of transportation, such as, for example, and without limitation, an automobile, a bus, a truck, a train, a bicycle, a motorcycle, or the like, providing a communication function, a data processing function, and/or a transportation function.

The above-described various example embodiments are implemented in processing circuitry including hardware components, software components or combinations of the hardware components and the software components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components.

The inventive concepts may be applied to various devices and/or systems including the integrity check devices and the electronic devices. For example, the inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an advanced driver assistance system (ADAS), an autonomous driving system, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An integrity check device comprising:
a register array including a plurality of registers that store a plurality of safety sensitive data forming one codeword; and
processing circuitry configured to
generate a current cyclic redundancy check (CRC) parity value by sequentially performing a CRC calculation on the plurality of safety sensitive data, to store a reference CRC parity value,
output a check result signal indicating whether an error occurs by activating a first path and by comparing the current CRC parity value with the reference CRC parity value when the plurality of safety sensitive data are maintained and when an operation of updating the reference CRC parity value is unnecessary, and
update the reference CRC parity value to the current CRC parity value by activating a second path when at least one of the plurality of safety sensitive data is intentionally changed and when the operation of updating the reference CRC parity value is necessary, wherein
the processing circuitry is further configured to
deactivate the second path in response to the first path being activated, and
deactivate the first path in response to the second path being activated, and
the first path includes first hardware and the second path includes second hardware different from the first hardware.

2. The integrity check device of claim 1, wherein:
while the CRC calculation is sequentially performed on the plurality of safety sensitive data, the processing circuitry is configured to check whether the at least one of the plurality of safety sensitive data is intentionally reset or modified, and
when it is determined that the at least one of the plurality of safety sensitive data is intentionally reset or modified, the processing circuitry is configured to set to update the reference CRC parity value based on whether the CRC calculation is performed on safety sensitive data that is reset or modified.

3. The integrity check device of claim 2, wherein:
one CRC calculation round is formed by sequentially performing the CRC calculation from first safety sensitive data to last safety sensitive data among the plurality of safety sensitive data, and
when the CRC calculation is not performed yet on the safety sensitive data that is reset or modified, the processing circuitry is configured to set to update the reference CRC parity value during a current CRC calculation round.

4. The integrity check device of claim 3, wherein, when the CRC calculation is already performed on the safety sensitive data that is reset or modified, the processing circuitry is configured to set to update the reference CRC parity value during a next CRC calculation round.

5. The integrity check device of claim 2, wherein, even if it is determined that the at least one of the plurality of safety sensitive data is intentionally reset or modified, the processing circuitry is configured to continue to perform the CRC calculation on the plurality of safety sensitive data without stopping the CRC calculation.

6. The integrity check device of claim 2, wherein:
the plurality of registers receive a plurality of write enable signals, and
when at least one of the plurality of write enable signals is activated, it is determined that the at least one of the plurality of safety sensitive data is intentionally reset or modified.

7. The integrity check device of claim 1, wherein:
while the CRC calculation is sequentially performed on the plurality of safety sensitive data, the processing circuitry is configured to check whether the at least one of the plurality of safety sensitive data is intentionally reset or modified, and when it is determined that the at least one of the plurality of safety sensitive data is intentionally reset or modified, the processing circuitry is configured to set to update the reference CRC parity value, and to stop the CRC calculation on the plurality of safety sensitive data and to perform the CRC calculation on the plurality of safety sensitive data again from beginning.

8. The integrity check device of claim 1, wherein the processing circuitry is further configured to:
generate the current CRC parity value by sequentially performing the CRC calculation on the plurality of safety sensitive data;
store the reference CRC parity value;
generate the check result signal by comparing the current CRC parity value with the reference CRC parity value;
based on a parity update signal, provide the current CRC parity value in the first path or provide the current CRC parity value in the second path; and
based on the parity update signal, provide the check result signal as a final output signal or provide a masking signal for masking an occurrence of the error as the final output signal.

9. The integrity check device of claim 8, wherein the first path includes a path for providing the current CRC parity value and a path for providing the check result signal as the final output signal.

10. The integrity check device of claim 8, wherein the second path includes a path for providing the current CRC parity value and a path for providing the masking signal as the final output signal.

11. The integrity check device of claim 8, wherein the processing circuitry is further configured to sequentially provide the plurality of safety sensitive data stored in the plurality of registers based on a register selection signal.

12. The integrity check device of claim 8, wherein the processing circuitry is further configured to, based on a CRC calculation done signal, provide the current CRC parity value.

13. The integrity check device of claim 8, wherein the processing circuitry is further configured to generate the parity update signal.

14. The integrity check device of claim 1, wherein:
one CRC calculation round is formed by sequentially performing the CRC calculation from first safety sensitive data to last safety sensitive data among the plurality of safety sensitive data, and
the CRC calculation round is periodically repeated to periodically check whether the error occurs.

15. The integrity check device of claim 14, wherein an execution cycle of the CRC calculation round decreases as an importance degree of the plurality of safety sensitive data increases.

16. The integrity check device of claim 14, wherein, when an execution cycle of the CRC calculation round is shorter than a reference cycle, the processing circuitry is configured to continue to perform the CRC calculation on the plurality of safety sensitive data without stopping the CRC calculation, even if the at least one of the plurality of safety sensitive data is intentionally reset or modified while the CRC calculation is sequentially performed on the plurality of safety sensitive data.

17. The integrity check device of claim 14, wherein, when a number of the plurality of registers is greater than a reference number, the processing circuitry is configured to continue to perform the CRC calculation on the plurality of safety sensitive data without stopping the CRC calculation, even if the at least one of the plurality of safety sensitive data is intentionally reset or modified while the CRC calculation is sequentially performed on the plurality of safety sensitive data.

18. An electronic device comprising:
a host device; and
a first integrity check device controlled by the host device, the first integrity check device configured to store a plurality of first safety sensitive data forming a first codeword that is a single codeword, to perform an operation of checking an error in the plurality of first safety sensitive data based on a cyclic redundancy check (CRC) calculation, and to perform an operation of updating a first reference CRC parity value, and
wherein the first integrity check device includes:
a first register array including a plurality of first registers that store the plurality of first safety sensitive data; and
first processing circuitry configured to
generate a first current CRC parity value by sequentially performing the CRC calculation on the plurality of first safety sensitive data, to store the first reference CRC parity value,
output a first check result signal indicating whether the error occurs by activating a first path and by comparing the first current CRC parity value with the first reference CRC parity value when the plurality of first safety sensitive data are maintained and when the operation of updating the first reference CRC parity value is unnecessary, and
update the first reference CRC parity value to the first current CRC parity value by activating a second path when at least one of the plurality of first safety sensitive data is intentionally changed and when the operation of updating the first reference CRC parity value is necessary,
wherein the first processing circuitry is further configured to
deactivate the second path in response to the first path being activated, and
deactivate the first path in response to the second path being activated, and
wherein the first path includes first hardware and the second path includes second hardware different from the first hardware.

19. The electronic device of claim 18, further comprising:
a second integrity check device controlled by the host device, the second integrity check device configured to store a plurality of second safety sensitive data forming a second codeword that is a single codeword, to perform an operation of checking an error in the plurality of second safety sensitive data based on the CRC calculation, and to perform an operation of updating a second reference CRC parity value.

20. An integrity check device comprising:
a register array including a plurality of registers that store a plurality of safety sensitive data forming one codeword and receive a plurality of write enable signals;
processing circuitry configured to
sequentially output the plurality of safety sensitive data stored in the plurality of registers based on a register selection signal;
generate a current CRC parity value by sequentially performing a CRC calculation on the plurality of safety sensitive data provided;
based on a CRC calculation done signal, output the current CRC parity value;

output the current CRC parity value to a first path or a second path based on a parity update signal;

store a reference CRC parity value;

generate a check result signal indicating whether an error occurs by comparing the current CRC parity value with the reference CRC parity value;

based on the parity update signal, provide the check result signal as a final output signal through the first path or provide a masking signal for masking an occurrence of the error as the final output signal through the second path; and generate the register selection signal, the CRC calculation done signal and the parity update signal, wherein, when the plurality of safety sensitive data are maintained and when an operation of updating the reference CRC parity value is unnecessary, the first path is activated to provide the check result signal as the final output signal, wherein, when at least one of the plurality of write enable signals is activated, when at least one of the plurality of safety sensitive data is intentionally changed and when the operation of updating the reference CRC parity value is necessary, the second path is activated to update the reference CRC parity value to the current CRC parity value and to provide the masking signal as the final output signal, and wherein, when it is determined that the at least one of the plurality of safety sensitive data is intentionally reset or modified while the CRC calculation is sequentially performed on the plurality of safety sensitive data, the reference CRC parity value is updated during a current CRC calculation round or a next CRC calculation round based on whether the CRC calculation is performed on safety sensitive data that is reset or modified, wherein the processing circuitry is further configured to
deactivate the second path in response to the first path being activated, and
deactivate the first path in response to the second path being activated, and wherein the first path includes first hardware and the second path includes second hardware different from the first hardware.

* * * * *